United States Patent [19]
Lee et al.

[11] Patent Number: 6,017,824
[45] Date of Patent: Jan. 25, 2000

[54] PASSIVATION ETCHING PROCEDURE, USING A POLYSILICON STOP LAYER, FOR REPAIRING EMBEDDED DRAM CELLS

[75] Inventors: Yu-Hua Lee, Hsinchu; James Wu, Kao-Hsiung, both of Taiwan

[73] Assignee: Taiwan Semiconductor Manufacturing Company, Hsin-Chu, Taiwan

[21] Appl. No.: 09/192,454

[22] Filed: Nov. 16, 1998

[51] Int. Cl.[7] .................................................. H01L 21/465
[52] U.S. Cl. ....................... 438/712; 438/723; 438/735; 438/740; 438/751; 438/756; 438/787
[58] Field of Search .................... 438/601, 132, 438/706, 735, 723, 712, 756, 751, 648, 740, 764, 787; 257/529

[56] References Cited

U.S. PATENT DOCUMENTS

| | | | |
|---|---|---|---|
| 4,740,485 | 4/1988 | Sharpe-Geisler | 437/246 |
| 5,235,205 | 8/1993 | Lippitt, III | 257/528 |
| 5,244,836 | 9/1993 | Lim | 437/192 |
| 5,538,924 | 7/1996 | Chen | 438/132 |
| 5,578,517 | 11/1996 | Yoo et al. | 438/601 |
| 5,585,662 | 12/1996 | Ogawa | 257/529 |
| 5,641,701 | 6/1997 | Fukuhara et al. | 438/6 |
| 5,665,638 | 9/1997 | Park | 438/4 |

*Primary Examiner*—Benjamin Utech
*Assistant Examiner*—Binh Tran
*Attorney, Agent, or Firm*—George O. Saile; Stephen B. Ackerman

[57] ABSTRACT

A process of opening, a stack of large diameter via holes, in a multiple levels of insulator layers, to be used for access of a laser repair procedure, applied to underlying integrated circuit shapes, while simultaneously opening small diameter via holes, in the same multiple levels of insulator layers, to be used to accommodate metal plug structures, has been developed. The process features the use of a polysilicon stop layer, used at the bottom of the stack of large diameter via holes, protecting underlying components of the underlying integrated circuit, from the dry and wet etching procedures used for the creation of the stack of large diameter via holes. The process also features the formation of metal spacers, on the sides of the large diameter via holes, created simultaneously during the formation of metal plug structures, and used again to protect the multiple levels of insulator layer, that would have been exposed, if left unprotected, during a wet etching procedure.

23 Claims, 7 Drawing Sheets

PASSIVATION ETCHING PROCEDURE, USING A POLYSILICON STOP LAYER, FOR REPAIRING EMBEDDED DRAM CELLS

BACKGROUND OF THE INVENTION

1. Field of the Invention

The present invention relates to the fabrication of a via hole, formed in several layers of insulator, and used to accommodate a laser repair procedure.

2. Description of Prior Art

Laser repairing, performed on high density memory chips, has allowed the yield of these high density memory chips, such as chips comprised with high density embedded, dynamic random access memory, (DRAM), to be increased. Laser repairing can be comprised of removing a defective DRAM array, while adding an additional non-defective, or a redundant array, to the DRAM chip. However to use laser repair, a feature such as a large via hole, opened in all the levels of insulator layer, and exposing the area, usually near or at the semiconductor surface, to be laser treated, has to be available. This can entail forming a via hole in all the levels of insulator layers, (referring to interlevel dielectric, (ILD), or inter-metal dielectric, (IMD), layers), which for an embedded DRAM array chip, can total an stack of insulator layers, about 5 to 10 micrometers in thickness. The ability to dry etch this thick stack of insulators, to create the via needed to accommodate laser repair, is difficult due to the large thickness of masking photoresist needed. A wet etching procedure, used to create the via, would result in isotropic undercutting, and possible yield loss. In addition, to optimize the repair procedure, a finite amount of insulator, between about 2000 to 8000 Angstroms, is needed to overlay the conductive fuse layer, that will be subjected to the laser repair procedure.

This invention will describe a novel procedure for fabricating a via hole, in the several levels of insulator, needed to accommodate the laser repair procedure. This invention will feature a polysilicon stop layer, formed on an underlying insulator layer, that is comprised with the optimum thickness, needed to allow laser repair of underlying arrays to occur. In addition, this invention will feature forming the large diameter via hole, in several levels of insulator layer, using the polysilicon stop layer, at the bottom of the large diameter via hole. The large diameter via hole, used for laser repair purposes, is simultaneously formed at each level of insulator layer, with the small diameter via holes, used to accommodate the conductive plugs, that are used between metal levels. The procedures, metal deposition and dry etching, used to create metal plugs in the small diameter via holes, result is metal spacers, on the sides of the large diameter via hole, thus protecting the interlevel insulators layers, from a wet etch procedure, used to remove portions of some of the interlevel insulator layers, that were not totally removed during the dry etching formation of the smaller via holes, with the final wet etch procedure used to expose the polysilicon stop layer. Prior art, such as Lippitt III, in U.S. Pat No. 5,235,205, describes the formation of a via hole, used for laser repair, but does not describe the novel metal spacers, used in this invention, used to protect the levels of insulator from a final wet etch procedure.

SUMMARY OF THE INVENTION

It is an object of this invention to create a large diameter via hole, in multiple interlevel insulator layers, to be used for access for a laser repair procedure, performed to an underlying conductive fuse structure, connected to elements of an integrated circuit.

It is another object of this invention to create the large diameter via hole, using the same stages of processing steps that are used to open the small diameter via holes, that are used to accommodate metal plug structures, used to interconnect metal levels.

It is still another object of this invention to use a polysilicon layer as an etch stop, at the bottom of the large diameter via hole, to protect underlying materials of an integrated circuit, during the removal of deposited levels of insulator layer, from the large diameter via hole.

It is still yet another object of this invention to form metal spacers on the sides of the large diameter via hole, simultaneously with the formation of metal plug structures, in the small diameter via holes.

It is still yet another object of this invention to remove the portion of the polysilicon stop layer, exposed at the bottom of the large diameter via hole, prior to the laser repair procedure.

In accordance with the present invention, a method is described for forming a large diameter via hole, used to allow access to a laser repair procedure, applied to underlying integrated circuit elements, with the method featuring the use of a polysilicon stop layer, located at the bottom of the large diameter via hole, and featuring metal spacers on the sides of the large diameter via hole. After forming an insulator layer, on a conductive fuse structure, a polysilicon stop layer is formed on the top surface of the insulator layer. A first interlevel dielectric layer, (ILD-1), is deposited, followed by the opening of a first level, large diameter via hole, to be used for access of a laser repair procedure, and opening of a first level, small diameter via hole, used to expose underlying elements of an integrated circuit. A metal deposition, completely filling the first level, small diameter via hole, followed by an anisotropic reactive ion etching procedure, result in a first level, metal plug structure, in the first level, small diameter via hole, and result in the formation of first level, metal spacers, on the exposed sides of the first level, large diameter via hole. After formation of first level metal interconnect structures, contacting the first level, metal plug structure, in the first level, small diameter via hole, ILD-2 layer is deposited, completely filling the first level, large diameter via hole. Second level, small diameter via holes are next opened in ILD-2, while a second level, large diameter via hole is simultaneously opened in ILD-2, directly overlying the first level, large diameter via hole, with a portion of ILD-2, still remaining in the first level, large diameter via hole. A metal deposition, followed by an anisotropic RIE procedure, results in the creation of second level metal plug structures, in the second level, small diameter via holes, while also resulting in second level, metal spacers, on the exposed sides of the second level, large diameter via hole. After formation of second level, metal interconnect structures, overlying and contacting the top surface of second level, metal plug structures, ILD-3 is deposited, completely filling second level, large diameter via hole. Third level, small diameter via holes, are next opened in ILD-3, exposing the top surface of second level, metal interconnect structures, while a third level, large diameter via hole, is simultaneously opened in ILD-3, directly overlying second level, large diameter via hole, with a portion of ILD-3, still remaining in the second level, large diameter via hole. Another metal deposition, and anisotropic RIE procedure, results in the creation of third level, metal plug structures, in the third level, small diameter via holes, in addition to forming third level, metal spacers, on the exposed sides of the third level, large diameter via hole. After formation of third level metal interconnect structures, overlying and contacting the top surface of the third level, metal plug structures, and deposition of a thick insulator passivation layer, photolithographic and wet etch procedures are used to pattern the thick passivation layer, and to remove the portion of ILD-3, and a portion of ILD-2, from second level, large diameter via hole, and from first level, large diameter via hole, respectfully. The portion of the polysilicon stop layer, exposed at the bottom of the stack of large diameter via holes, is removed, exposing the insulator layer, directly overlying the conductive fuse structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating a large diameter via hole, in multiple layers of insulator, used to allow access for laser repair of an underlying integrated circuit, and featuring a polysilicon stop layer at the bottom of, and metal spacers on the sides of, the large diameter via hole, will now be described in detail. The integrated circuit, referred to in this invention, is comprised of complimentary metal oxide semiconductor, (CMOS), devices, and an embedded DRAM array, however the use of laser repair, utilizing the large diameter via hole, of this invention, can be applied to other integrated circuits, comprised of static random access memory, (SRAM), BiCMOS, or bipolar devices.

Figure 1:
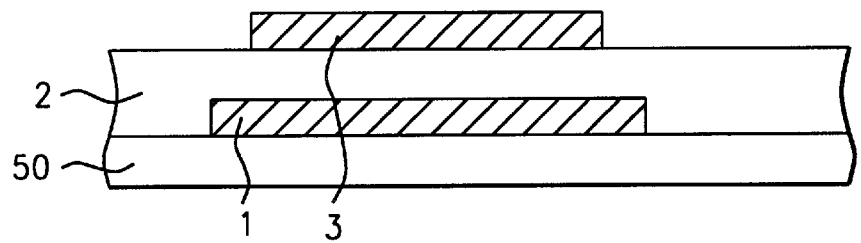
FIGS. 1, 2, 3, 4, 5, 6, 7, 8, 9, 10, 11, 12 and 13, which schematically, in cross-sectional style, show the key stages of fabrication, used to create the large diameter via hole, used for laser repair of underlying integrated circuits, featuring a polysilicon stop layer, at the bottom of, and metal spacers on the sides of, the large diameter via hole.

A fuse structure 1, comprised of polysilicon, is schematically shown in FIG. 1. Fuse structure 1, on a semiconductor substrate 50, is a link between integrated circuit elements, located in, and on, semiconductor substrate 50. Fuse structure 1, at a thickness between about 1000 to 3000 Angstroms, is located in an area to subsequently comprise a large diameter via hole. An insulator layer 2, comprised of silicon oxide, at a thickness between about 5000 to 10000 Angstroms, is used to passivate the integrated circuit elements, to which fuse structure 1, is connected to. Insulator layer 2, is subjected to a chemical mechanical polishing, (CMP), procedure, to create a smooth top surface topography. A polysilicon layer is next deposited via low pressure chemical vapor deposition, (LPCVD), procedures, to a thickness between about 500 to 3000 Angstroms. Conventional photolithographic and reactive ion etching. (RIE), procedures, using $Cl_2$ as an etchant, are used to create polysilicon stop layer 3, schematically shown in FIG. 1. Polysilicon stop layer 3, overlays fuse structure 1, with between about 1000 to 2000 Angstroms, of insulator layer 2, separating polysilicon stop layer 3, and fuse structure 1. The photoresist shape, used to define polysilicon stop layer 3, is removed via plasma oxygen ashing and careful wet cleans.

Figure 2:
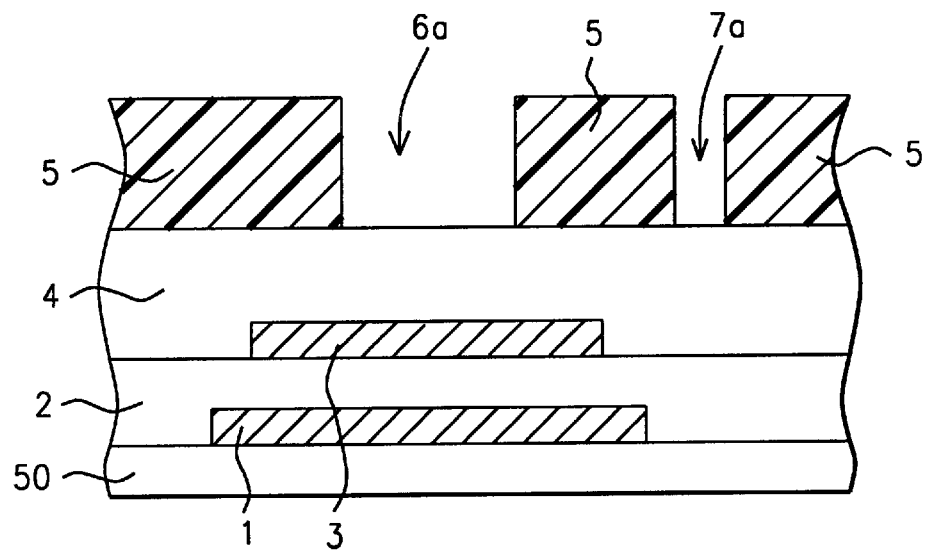
Figure 3:
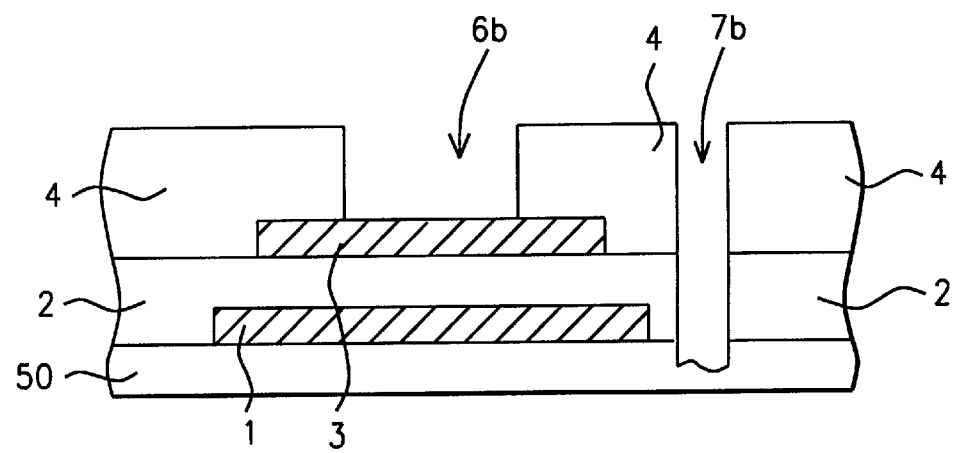
Figure 4:
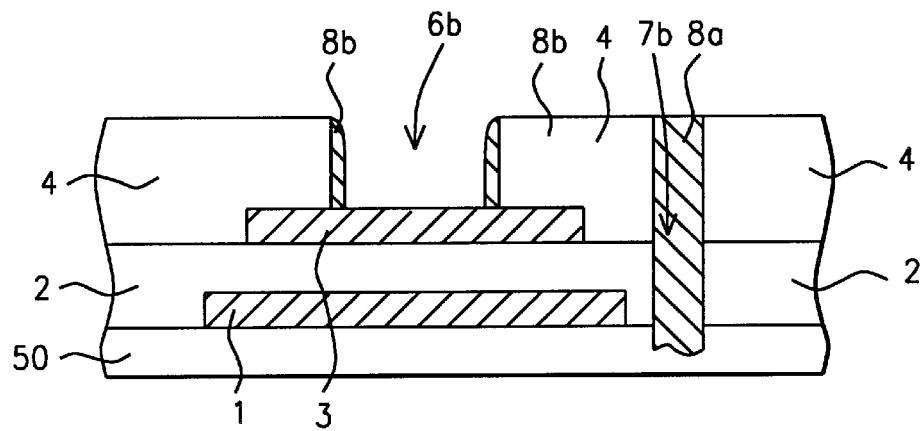

A first interlevel dielectric, (ILD-1), layer 4, comprised of silicon oxide, is next deposited, via LPCVD or plasma enhanced chemical vapor deposition, (PECVD), procedures, to a thickness between about 5000 to 12000 Angstroms. Planarization of ILD-1 layer 4, is again accomplished via CMP procedures, resulting in a smooth top surface topography. A photoresist shape 5, shown schematically in FIG. 2, is next formed with opening 6a, exposing a portion of ILD-1 layer 4, in a region directly over polysilicon stop layer 3, while opening 7a, exposed a portion of ILD-1 layer 4, in a region overlying elements of an integrated circuit, (not shown in the drawings). A RIE procedure, using $CHF_3$ as an etchant, and photoresist shape 5, as an etch mask, is employed to create first level, large diameter via hole 6b, in ILD-1 layer 4, with the dry etching procedure, terminating at polysilicon stop layer 3. First level, large diameter via hole 6b, has a diameter between about 5 to 10 um, designed to allow subsequent access to a laser repair procedure, applied to fuse structure 1. The identical RIE procedure also results in the creation of first level, small diameter via hole 7b, schematically shown in FIG. 3. First level, small diameter via hole 7b, with a diameter between about 2500 to 5000 Angstroms, is opened to expose the top surface of elements of the integrated circuit, (not shown in the drawings). Photoresist shape 5, is removed via plasma oxygen ashing and careful wet cleans. A tungsten layer is next deposited, via LPCVD procedures, using silane and tungsten hexafluoride as reactants, to a thickness between about 3000 to 6000 Angstroms, completely filling first level, small diameter via hole 7b. An anisotropic RIE procedure, using $Cl_2$ as an etchant, is used to selectively remove tungsten from the top surface of ILD-1 layer 4, resulting in the formation of first level metal plug structure 8a, in first level, small diameter via hole 7b, and resulting in first level metal spacers 8b, on the sides of first level, large diameter via hole 6b, this is schematically shown in FIG. 4. If only large diameter via holes are being fabricated, silicon nitride can be used for the spacers, on the sides of the large diameter via holes.

Figure 5:
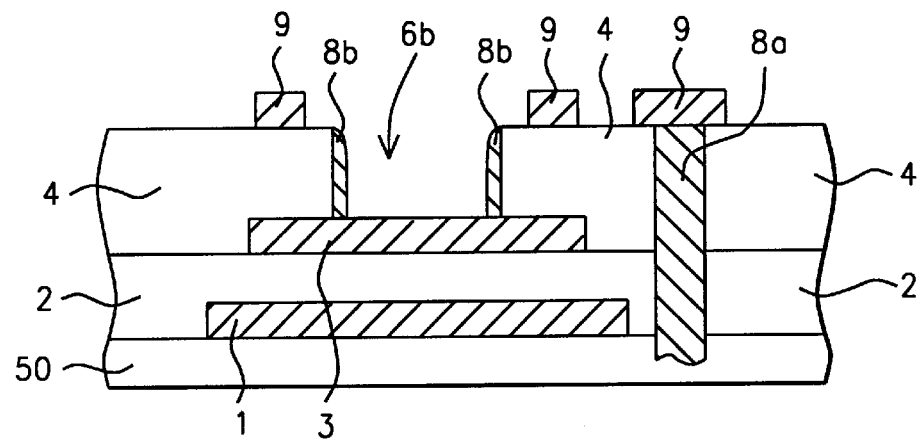

First level metal interconnect structures 9, are next formed and shown schematically in FIG. 5. An aluminum based layer, containing between about 0.5 to 1.0 weight % copper, is deposited, via R.F. sputtering procedures, to a thickness between about 3000 to 6000 Angstroms. Conventional photolithographic, and RIE procedures, using $Cl_2$ as an etchant, are used to pattern the aluminum based layer, creating first level metal interconnect structures 9. The photoresist shape, used to define first level metal interconnect structures 9, is removed via plasma oxygen ashing and careful wet cleans. A first level metal interconnect structure is shown overlying and contacting first level metal plug structure 8a, which in turn communicates with elements of the integrated circuit. The patterning of first level metal interconnect structures 9, create thin spacers on the sides of first level metal spacers 8b. However the use of R.F. sputtering, results in only a thin aluminum layer on the sides of the large diameter via hole, due to the poor conformality of R.F. sputtered films. The thin aluminum spacers are not shown in the drawings.

Figure 6:
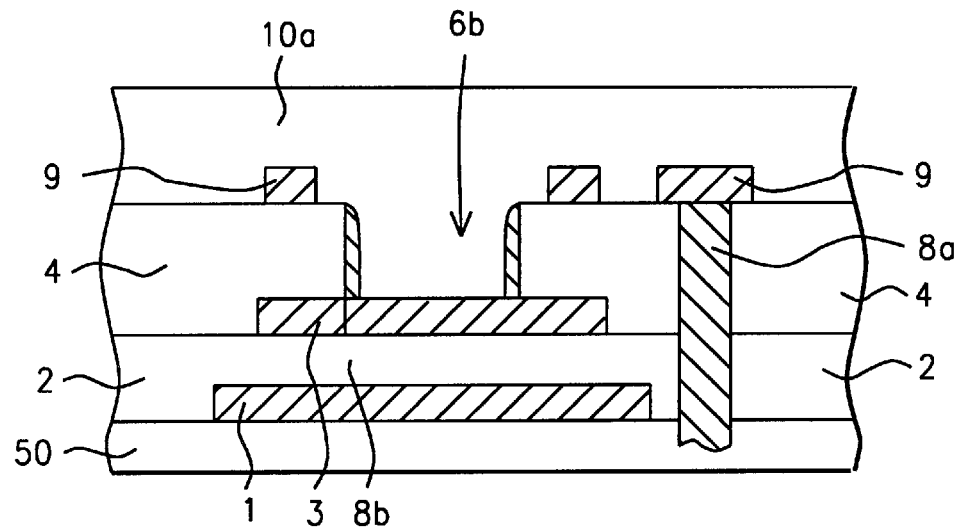
Figure 7:
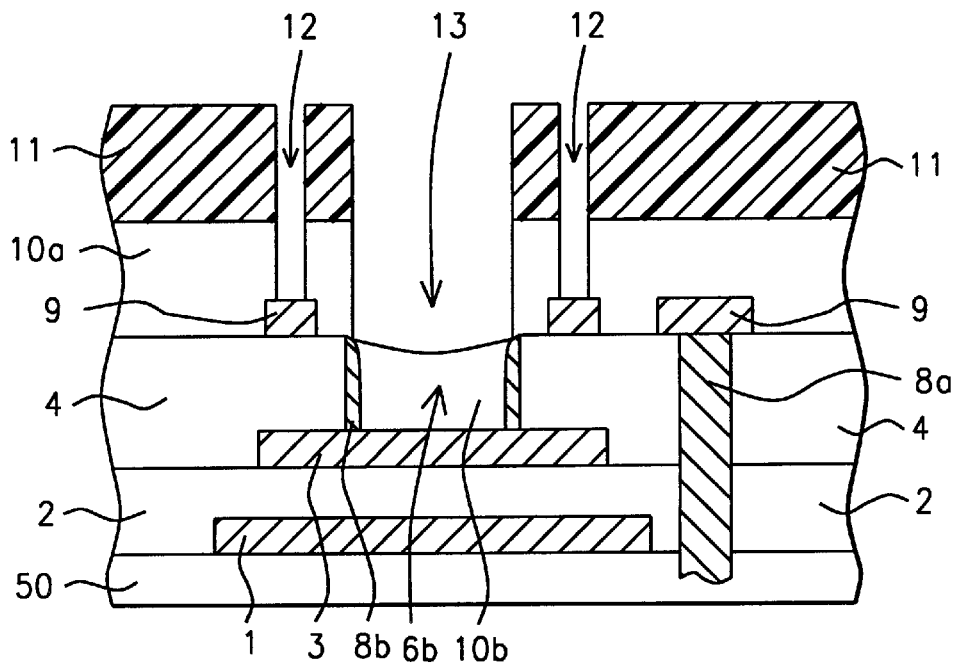

FIG. 6, schematically shows the deposition of ILD-2 layer 10a, comprised of silicon oxide, via LPCVD or PECVD procedures, to a thickness between about 10000 to 15000 Angstroms, completely filling first level, large diameter via hole 6b. A chemical mechanical polishing, (CMP), procedure is used for planarization purposes, resulting in a smooth top surface topography for ILD-2 layer 10a. Photoresist shape 11, is used as a mask, to allow an anisotropic RIE procedure, using $CHF_3$ as an etchant, to create second level, large diameter via hole 13, and second level, small diameter via hole 12, in ILD-2 layer 10a. The result of this procedure, schematically shown in FIG. 7, is the incomplete removal of ILD-2 layer 10a, from first level, large diameter via hole 6b, resulting in portion 10b, of ILD-2 layer 10a, still remaining in first level, large diameter via hole 6b. Layerl 10b, if not subsequently removed, would adversely influence the laser repair procedure, which is engineered to be performed in insulator free, large diameter via holes. Second level, small diameter via holes 12, offer exposure to the top surface of first level metal interconnect structures 9.

Figure 8:
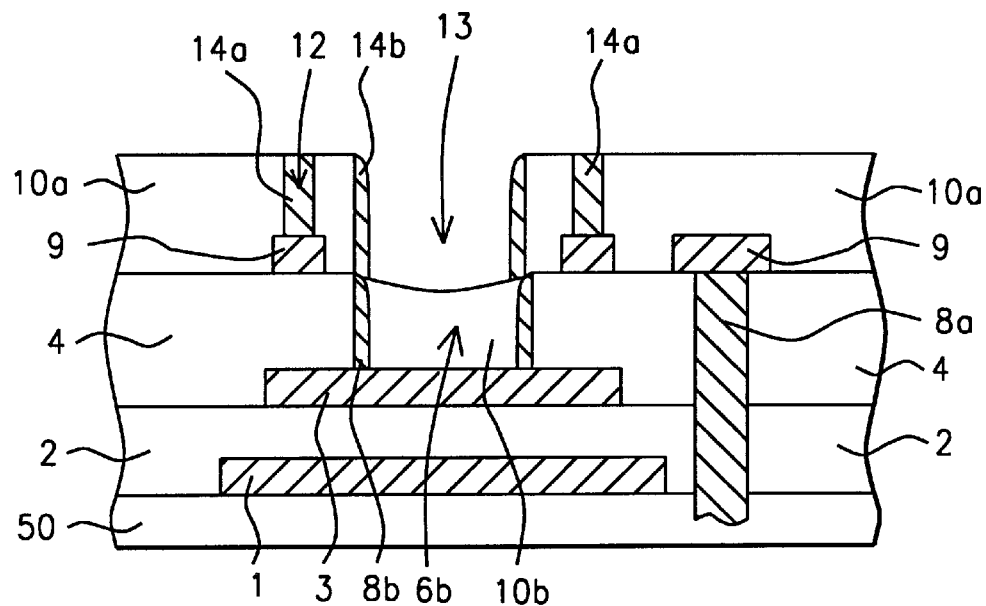

After removal of photoresist shape 11, via plasma oxygen ashing and careful wet cleans, another tungsten layer is deposited, via LPCVD procedures, to a thickness between about 4000 to 7000 Angstroms, completely filling second level, small diameter via holes 12. A blanket, anisotropic RIE procedure, using $Cl_2$ as an etchant, is again employed, to selectively remove tungsten from the top surface of ILD-2 layer 10a, creating second level metal plug structures 14a, in second level, small diameter via holes 12. In addition the RIE procedure create second metal spacers 14b, on the sides of second level, large diameter via hole 13. This is schematically shown in FIG. 8.

Figure 9:
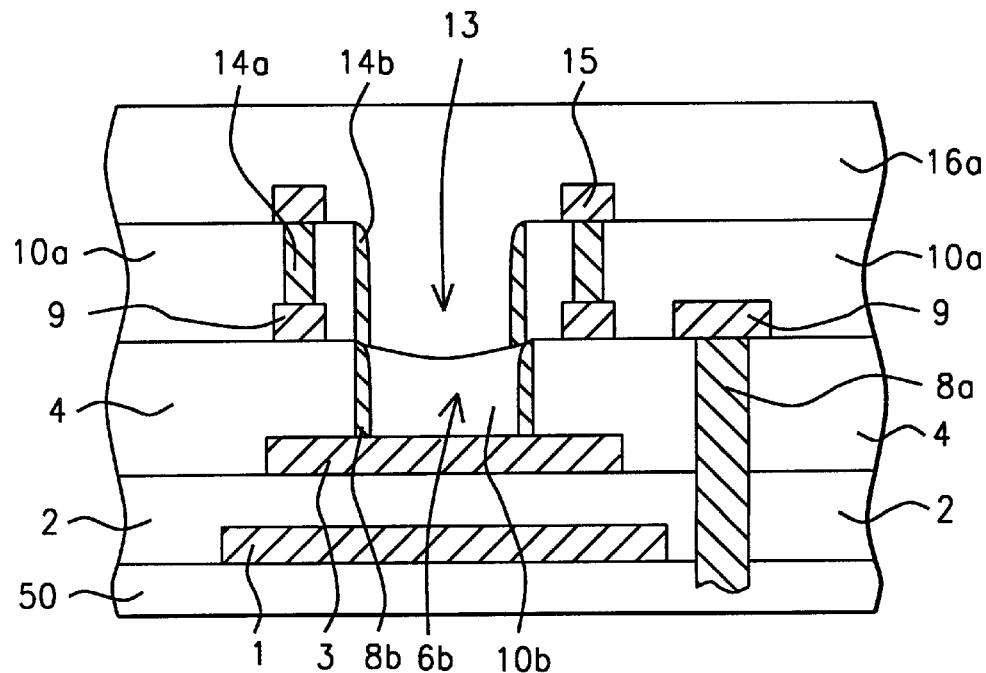

Second level metal interconnect structures 15, are next formed, via R.F. deposition of an aluminum based metal layer, to a thickness between about 3000 to 6000 Angstroms, comprised with between about 0.5 to 1.0 weight % copper. Conventional photolithographic and RIE procedures, using $Cl_2$ as an etchant, are used to create second level metal interconnect structures 15, overlying and contacting the top surface of second level metal plug structures 14a. This is schematically shown in FIG. 9. After removal of the photoresist shape used to define second level metal interconnect structures 15, via plasma oxygen ashing and careful wet cleans, ILD-3 layer 16a, comprised of silicon oxide, is deposited via LPCVD or PECVD procedures, to a thickness between about 10000 to 15000 Angstroms, completely filling second level, large diameter via hole 13. This is schematically shown in FIG. 9. Again, as was the case for first level metal interconnect structures 9, the use of R.F, sputtering, results in only a very thin deposit on the exposed sides, therefore not shown in the drawings.

Figure 10:
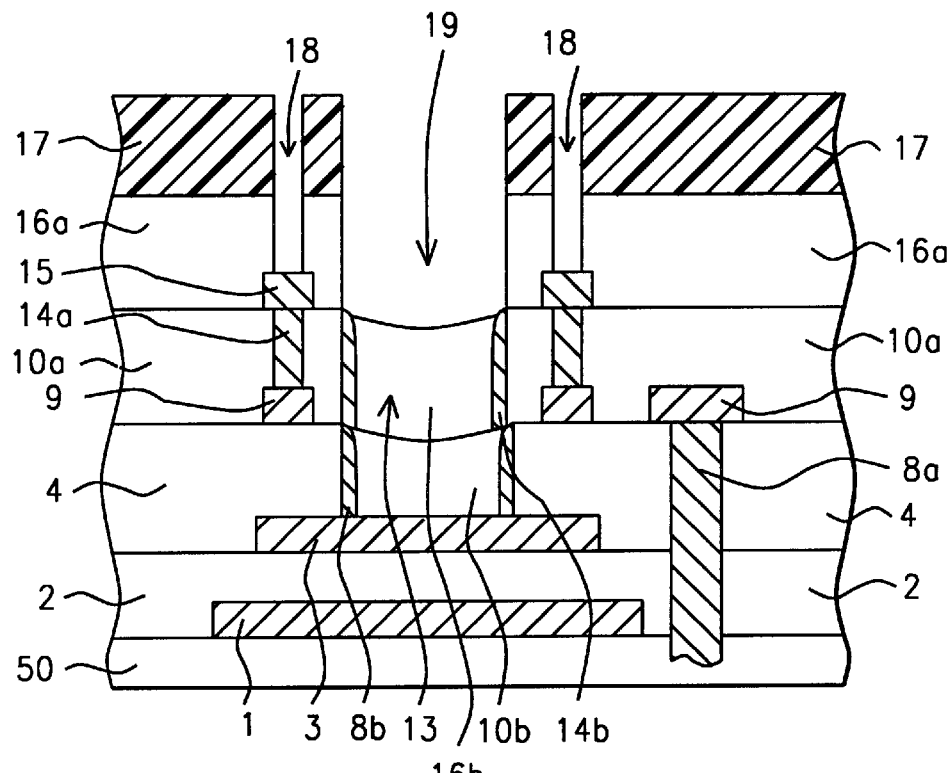

FIG. 10, schematically shows the creation of third level, small diameter via holes 18, and the creation of third level, large diameter via hole 19, in ILD-3 layer 16a. Photoresist shape 17, is used as an etch mask, during an anisotropic RIE procedure, using $CHF_3$ as an etchant, used to create the third level via holes. The opening of third level, small diameter via holes 18, expose the top surface of second level metal interconnect structures 15, while only a portion of ILD-3 layer 16a, is removed from second level, large diameter via hole 13, creating silicon oxide portion 16b, residing in second level, large diameter via hole 13.

Figure 11:
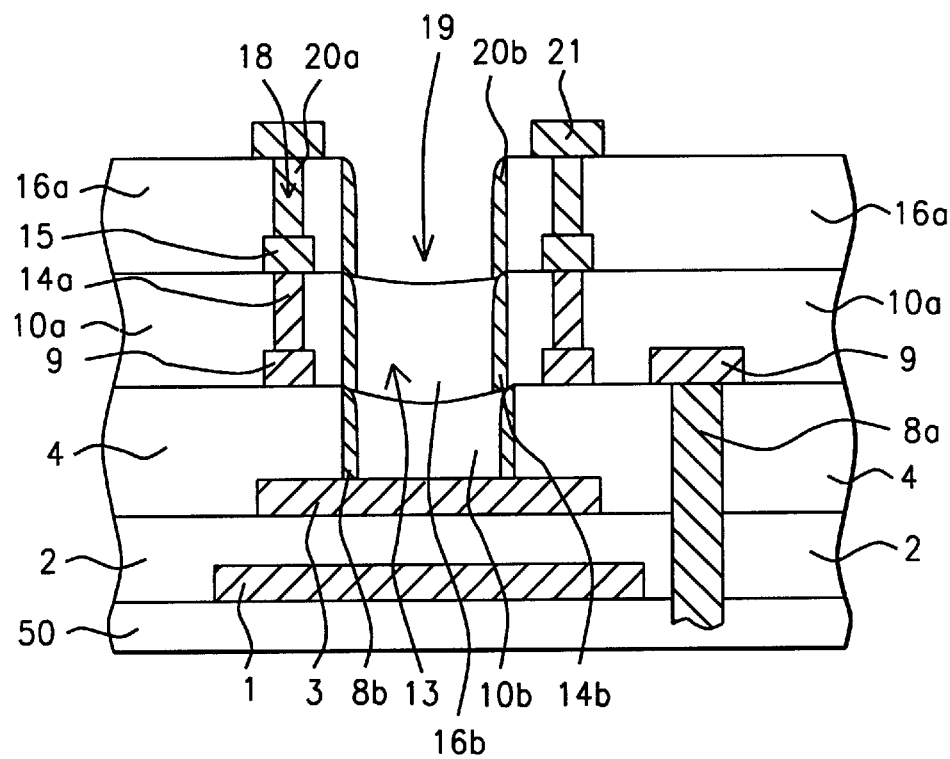

After removal of photoresist shape 17, via plasma oxygen ashing and careful wet cleans, a tungsten layer is deposited via LPCVD procedures, to a thickness between about 4000 to 7000 Angstroms, completely filling third level, small diameter via holes 18. An anisotropic RIE procedure, using $Cl_2$ as an etchant, is used to selectively remove tungsten from the top surface of ILD-3 layer 16a, resulting in the formation of third level, metal plug structures 20a, in third level, small diameter via holes 18. The same RIE procedure, remove tungsten from the top surface of portion 16b, of ILD-3 layer 16a, resulting in third level metal spacers 20b, on the sides of third level, large diameter via hole 19. This is schematically shown in FIG. 11. Third level, metal interconnect structures 21, are next formed and also schematically shown in FIG. 11. This is accomplished via the R.F. deposition of an aluminum based layer, to a thickness between about 4000 to 9000 Angstroms, comprised with between about 0.5 to 1.0 weight % copper, followed by a patterning procedure, consisting of conventional photolithographic and RIE procedures, using $Cl_2$ as an etchant, creating third level, metal interconnect structures 21. The photoresist shape, used for definition of third level, metal interconnect structures 21, is removed via plasma oxygen ashing and careful wet cleans.

Figure 12:
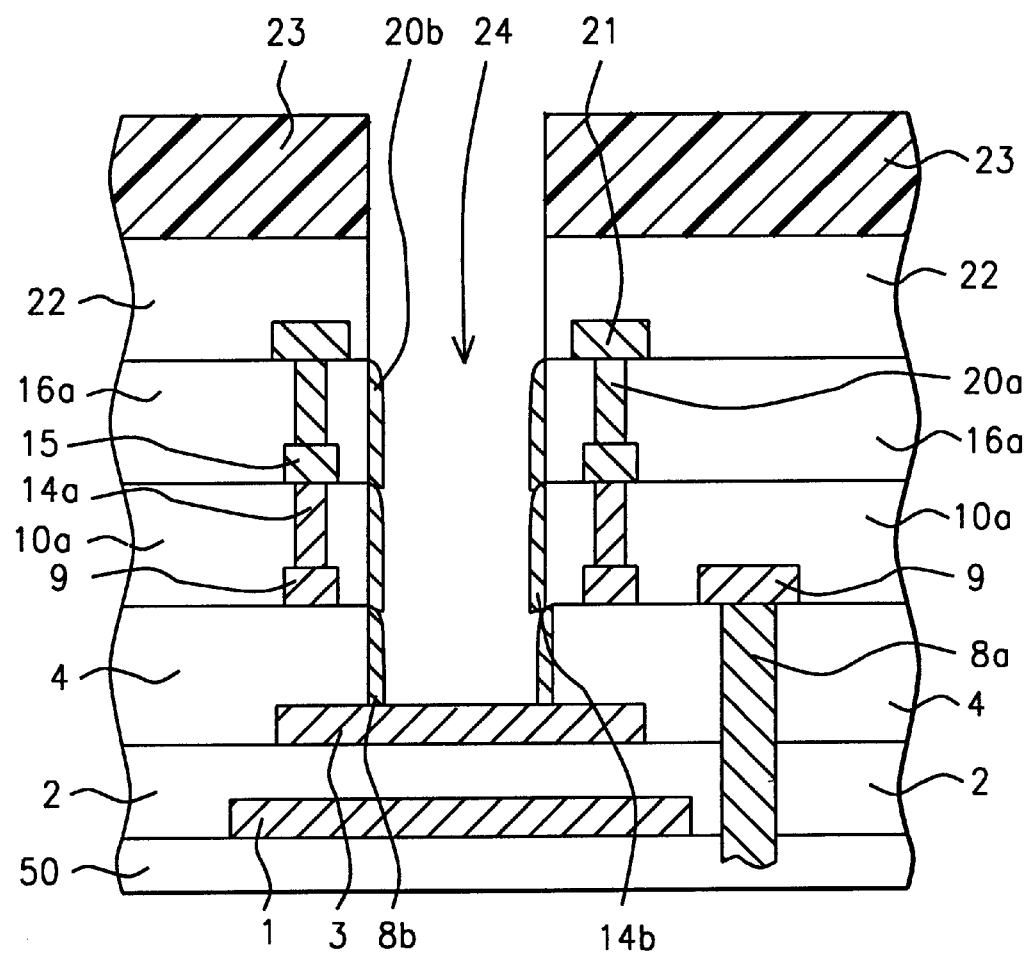

A passivation layer 22, comprised of an underlying layer of silicon oxide, at a thickness between about 2000 to 5000 Angstroms, and an overlying layer of silicon nitride, at a thickness between about 5000 to 7000 Angstroms, are next deposited via LPCVD or PECVD procedures. Photoresist shape 23, with opening 24, equal in diameter to the diameter of the large diameter via holes, is used to create an opening in passivation layer 22, using a dry etch procedure for the overlying silicon nitride layer, than using photoresist shape 23, as a mask to allow a wet etch procedure, to pattern the silicon oxide component, of passivation layer 22, and to remove ILD-3 portion 16b, and ILD-2 portion 10b, from the large diameter via holes, exposing the top surface of polysilicon stop layer 3. The wet etch procedure, used to remove unwanted insulator layer from the large diameter via holes, enabling subsequent access to the underlying fuse structure 1, for a laser repair procedure, is accomplished using a buffered hydrofluoric, (BHF), acid solution. Metal spacers 20b, 14b, and 8b, protecting ILD layers 16a, 10a, and 4, from BHF attack, while polysilicon stop layer 3, protected insulator 2, from the BHF procedure, and preserved the desired thickness of insulator layer 2, needed for the laser repair procedure. This is schematically shown in FIG. 12.

Figure 13:
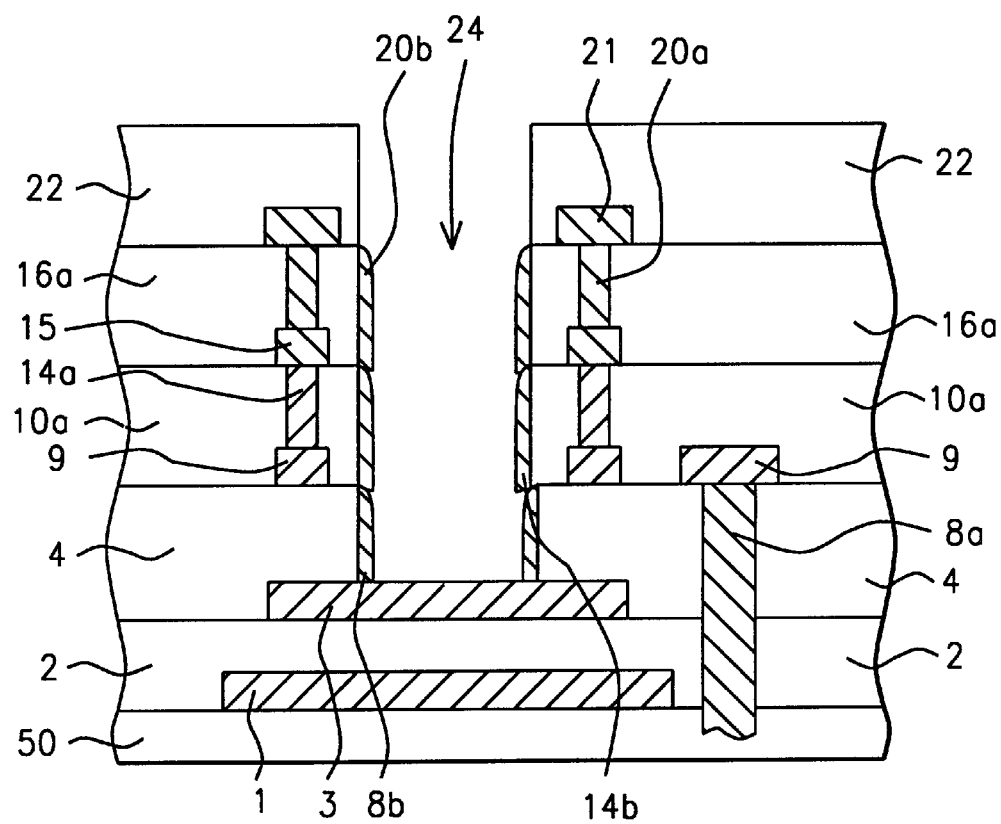

Prior to removal of photoresist shape 23, once again accomplished via plasma oxygen ashing and careful wet cleans, regions of exposed polysilicon stop layer 3, are removed via a dry etching procedure, exposing a region of insulator layer 2, directly over fuse structure 1. This is schematically shown in FIG. 13. The accurate amount of insulator layer 2, overlying fuse structure 1, preserved during the procedures used to create the stack of large diameter via holes, via use of the polysilicon stop layer, and the metal spacers, will allow an optimum laser repair procedure to be performed, if needed, to underlying elements of an integrated circuit, via use of laser applications to fuse structure 1.

While this invention has been particularly shown and described with reference to the preferred embodiments thereof, it will be understood by those skilled in the art that various changes in form and details may be made without departing from the spirit and the scope of this invention.

What is claimed is:

1. A method of fabricating a via hole, in multiple levels of interlevel dielectric layers, on a semiconductor substrate, comprising the steps of:

providing regions of an integrated circuit on said semiconductor substrate, with a fuse structure located between a first, and a second region of said semiconductor substrate;

forming a silicon oxide layer on said integrated circuits, and on said fuse structure;

forming a polysilicon shape, on the top surface of said silicon oxide layer, in a region in which said silicon oxide layer overlays said fuse structure;

forming a first via hole in a first interlevel dielectric, (ILD), layer, exposing a portion of the top surface of said polysilicon shape;

forming first spacers on the sides of said first via hole;

forming a second via hole, in a second ILD layer, with said second via hole directly overlying said first via hole, and with a portion of said second ILD layer remaining in said first via hole;

forming second spacers on the sides of said second via hole;

forming a third via hole, in a third ILD layer, with said third via hole directly overlying said second via hole, and with a portion of said third insulator layer remaining in said second via hole;

forming third spacers on the sides of said third via hole; and performing a wet etch procedure, removing said portion of said third ILD layer from said second via hole, and removing said portion of said second ILD layer from said first via hole, resulting in said via hole, in said multiple levels of ILD layers, exposing a portion of the top surface of said polysilicon shape, in a region in which said polysilicon shape, on said silicon oxide layer, overlays said fuse structure.

2. The method of claim 1, wherein said integrated circuit, is comprised of embedded DRAM arrays.

3. The method of claim 1, wherein said fuse structure is comprised of polysilicon, at a thickness between about 1000 to 3000 Angstroms.

4. The method of claim 1, wherein said silicon oxide layer, located between said overlying polysilicon shape, and underlying said fuse structure, is obtained via LPCVD or PECVD procedures, at a thickness between about 5000 to 10000 Angstroms.

5. The method of claim 1, wherein said polysilicon shape is formed from a polysilicon layer, deposited via LPCVD procedures, at a thickness between about 500 to 3000 Angstroms, and patterned via RIE procedures, using $Cl_2$ as an etchant.

6. The method of claim 1, wherein said first ILD layer, is comprised of silicon oxide, obtained via LPCVD or PECVD procedures, to a thickness between about 5000 to 12000 Angstroms.

7. The method of claim 1, wherein said first via hole, is formed in said first ILD layer, via a RIE procedure, using $CHF_3$ as an etchant, with said first via hole having a diameter between about 5 to 10 um.

8. The method of claim 1, wherein said first spacers, said second spacers, and said third spacers, are comprised of tungsten, formed from a tungsten layer, obtained via LPCVD procedures, at a thickness between about 3000 to 6000 Angstroms, and subjected to an anisotropic RIE procedure, using $Cl_2$ as an etchant.

9. The method of claim 1, wherein said second ILD layer is comprised of silicon oxide, obtained via LPCVD or PECVD procedures, to a thickness between about 10000 to 15000 Angstroms.

10. The method of claim 1, wherein said second via hole is formed in said second ILD layer, via a RIE procedure, using $CHF_3$ as an etchant.

11. The method of claim 1, wherein said third ILD layer is comprised of silicon oxide, obtained via LPCVD or PECVD procedures, at a thickness between about 10000 to 15000 Angstroms.

12. The method of claim 1, wherein said third via hole is formed in said third ILD layer, via a RIE procedure, using $CHF_3$ as an etchant.

13. The method of claim 1, wherein said portion of said second ILD layer, in said first via hole, and said portion of said third ILD layer, in said second via hole, are removed using a buffered hydrofluoric acid solution.

14. A method of simultaneously forming a large diameter via hole, and a small diameter via hole, in multiple levels of interlevel dielectric layers, on a semiconductor substrate, comprising the steps of:

providing a first region of an embedded DRAM array, and a second region of an embedded DRAM array, on said semiconductor substrate, with a fuse structure located between said first region, and said second region, of embedded array;

depositing a silicon oxide;

forming a polysilicon stop layer, on said silicon oxide layer, directly overlying said fuse structure;

depositing a first interlevel dielectric layer, (ILD), forming a first, large diameter via hole, in said first ILD layer, exposing a portion of the top surface of said polysilicon stop layer, while simultaneously forming a first, small diameter via hole, in said first ILD layer, exposing the top surface of an element in underlying, said embedded array;

forming a first tungsten plug structure, in said first, small diameter via hole, while simultaneously forming first tungsten spacers, on the sides of said first, large diameter via hole;

forming a first metal interconnect structure, on the top surface of said first ILD layer, with said first interconnect structure, overlying and contacting, the top surface of said first tungsten plug structure;

depositing a second ILD layer;

forming a second, large diameter via hole, in said second insulator layer, directly overlying said first, large diameter via hole, while simultaneously forming a second, small diameter via hole, in said second ILD layer, exposing the a portion of the top surface of said first metal interconnect structure, with a portion of said second ILD layer, remaining in said first, large diameter via hole;

forming a second tungsten plug structure, in said second, small diameter via hole, while simultaneously forming second tungsten spacers, on the sides of said second, large diameter via hole;

forming a second metal interconnect structure, on the top surface of said third ILD layer, with said second metal interconnect structure, overlying and contacting, the top surface of said second tungsten plug structure;

depositing a third ILD layer;

forming a third, large diameter via hole, in said third ILD layer, directly overlying said second, large diameter via hole, while simultaneously forming a third, small diameter via hole, in said third ILD layer, exposing a portion of the top surface of said second metal interconnect structure, and with a portion of said third ILD layer, remaining in said second, large diameter via hole, overlying said portion of second ILD layer, located in said first, large diameter via hole;

forming a third tungsten plug structure, in said third, small diameter via hole, while simultaneously forming third tungsten spacers on the sides of said third, large diameter via hole;

forming a third metal interconnect structure, on the top surface of said third ILD layer, with said third metal interconnect structure overlying, and contacting, the top surface of third tungsten plug structure;

depositing a thick passivation insulator layer; and using a photoresist shape as a mask, performing a wet etch procedure to create an opening in said passivation insulator layer, directly overlying said third, large diameter via hole, and removing said portion of third ILD layer, from said second, large via hole, and removing said portion of second ILD layer, from said first, large diameter via hole, exposing a portion of said polysilicon stop layer.

15. The method of claim 14, wherein said fuse structure is comprised of polysilicon, at a thickness between about 1000 to 3000 Angstroms.

16. The method of claim 14, wherein said silicon oxide layer, overlying said fuse structure, is obtained via LPCVD or PECVD procedures, at a thickness between about 5000 to 10000 Angstroms.

17. The method of claim 14, wherein said polysilicon stop layer is formed from a polysilicon layer, obtained via LPCVD procedures, at a thickness between about 500 to 3000 Angstroms, and patterned via an RIE procedure, using $Cl_2$ as an etchant.

18. The method of claim 14, wherein said first ILD layer, is a silicon oxide layer, obtained via LPCVD or PECVD procedures, at a thickness between about 5000 to 12000 Angstroms.

19. The method of claim 14, wherein said first, large diameter via hole, and said first, small diameter via hole, are formed in said first ILD layer, via a RIE procedure, using $CHF_3$ as an etchant, with said first, large diameter via hole, having a diameter between about 5 to 10 um, and with said first, small diameter via hole having a diameter between about 2500 to 5000 Angstroms.

20. The method of claim 14, wherein said first tungsten spacers, are formed on the sides of said first, large diameter via hole, via deposition of a tungsten layer, using an LPCVD procedure, at a thickness between about 3000 to 6000 Angstroms, followed by an anisotropic RIE procedure, using $Cl_2$ as an etchant.

21. The method of claim 14, wherein said first tungsten plug structure, in said first, small diameter via hole, is formed via deposition of a tungsten layer, using an LPCVD procedure, followed by an anisotropic RIE procedure, using $Cl_2$ as an etchant.

22. The method of claim 14, wherein said passivation layer is comprised of an overlying silicon nitride layer, at a thickness between about 5000 to 7000 Angstroms, and an underlying silicon oxide layer, at a thickness between about 2000 to 5000 Angstroms, both obtained via LPCVD or PECVD procedures.

23. The method of claim 14, wherein said wet etch procedure, used to create opening in the silicon oxide component of said passivation layer, and used to remove said portion of third ILD layer, from said second, large diameter via hole, and to remove said portion of second ILD layer, from said first, large diameter via hole, is accomplished using a buffered hydrofluoric acid solution.

* * * * *